(12) United States Patent
Ferguson et al.

(10) Patent No.: US 12,032,073 B2
(45) Date of Patent: Jul. 9, 2024

(54) DRONE CARRYING A PHYSICAL IDENTIFIER

(71) Applicant: Autonomous Industrial Solutions, LLC, Batesville, MS (US)

(72) Inventors: Conor Ferguson, Batesville, MS (US); Austin Ratcliffe, Batesville, MS (US)

(73) Assignee: Autonomous Industrial Solutions, LLC, Batesville, MS (US)

( * ) Notice: Subject to any disclaimer, the term of this patent is extended or adjusted under 35 U.S.C. 154(b) by 0 days.

(21) Appl. No.: 17/983,304

(22) Filed: Nov. 8, 2022

(65) Prior Publication Data

US 2024/0004083 A1 Jan. 4, 2024

Related U.S. Application Data

(63) Continuation of application No. 17/035,399, filed on Sep. 28, 2020, now Pat. No. 11,493,641, which is a continuation of application No. 16/137,092, filed on Sep. 20, 2018, now Pat. No. 10,788,588.

(60) Provisional application No. 62/589,166, filed on Nov. 21, 2017.

(51) Int. Cl.
| | |
|---|---|
| G01S 19/28 | (2010.01) |
| B64C 39/02 | (2023.01) |
| G01R 29/00 | (2006.01) |
| G01S 5/06 | (2006.01) |
| H01Q 1/24 | (2006.01) |
| H04B 7/185 | (2006.01) |
| H01Q 1/28 | (2006.01) |

(52) U.S. Cl.
CPC ............ *G01S 19/28* (2013.01); *B64C 39/024* (2013.01); *G01R 29/00* (2013.01); *G01S 5/06* (2013.01); *H01Q 1/241* (2013.01); *H04B 7/18506* (2013.01); *H01Q 1/28* (2013.01)

(58) Field of Classification Search
CPC ........ G01S 19/28; G01S 5/06; B64C 39/024; G01R 29/00; H01Q 1/241; H04B 7/18506
USPC .................................................. 342/357.67
See application file for complete search history.

(56) References Cited

U.S. PATENT DOCUMENTS

| | | | | |
|---|---|---|---|---|
| 9,058,678 | B1 * | 6/2015 | Le Grand | G06T 17/005 |
| 9,807,552 | B1 * | 10/2017 | Singhal | H04W 4/021 |
| 9,867,109 | B1 * | 1/2018 | Parihar | H04W 40/22 |
| 2015/0109946 | A1 * | 4/2015 | Sharma | H04W 36/00835 |
| | | | | 370/252 |
| 2018/0019802 | A1 * | 1/2018 | Teague | H04W 12/0471 |

FOREIGN PATENT DOCUMENTS

WO WO-2018167351 A1 * 9/2018 ........ H04W 36/0058

* cited by examiner

*Primary Examiner* — Harry K Liu
(74) *Attorney, Agent, or Firm* — Dennen IP Law, LLC

(57) ABSTRACT

A system that has an unmanned aerial vehicle (UAV) and a physical cell identity (PCI) scanner coupled to the UAV, the scanner covering frequencies using an omni-directional or directional antenna for capturing PCI data. The system further has logic configured to geotag the PCI data with a latitude, a longitude, an altitude, and a direction of the UAV, save the data in files for analyzation, and generate three-dimensional models using the geotag PCI data to find weak points in signal coverage.

15 Claims, 13 Drawing Sheets

DRONE CARRYING A PHYSICAL IDENTIFIER

CROSS-REFERENCE TO RELATED APPLICATION

This application is a continuation of and claims priority to U.S. patent application Ser. No. 17/035,399 entitled Systems and Methods for Determining an Optimal Location for the Installation of a Reception Antenna and filed on Sep. 28, 2020, which is a continuation and claims priority to U.S. patent application Ser. No. 16/137,092 entitled Systems and Methods for Determining an Optimal Location for the Installation of a Reception Antenna and filed on Sep. 18, 2018, which claims priority to U.S. Provisional Patent Application Ser. No. 62/589,166 entitled Method of Determining Optimal Locations for the Installation of Reception Antennas and filed on Nov. 21, 2017, all of which are incorporated herein by reference.

BACKGROUND

A network of cell towers is used to receive and transmit radio waves to/from a destination. The radio waves can comprise data that implements Internet connectivity and cellular service to the destination. In this regard, the destination may be, for example, a cellular phone, a residence, or a business site. Oftentimes, the destinations are in rural areas and/or surrounded by natural barriers, such as mountains and the like.

Electric communications equipment and antennas are typically mounted on the towers. These components are configured to receive data from other towers and transmit the data from tower to tower until the data arrives at its destination. To receive signals at the destination from the tower, the destination is outfitted with a strategically placed antenna that is conducive to the most adequate and efficient wireless service.

Wireless Internet service providers, autonomous metering infrastructure network surveyors and cellular service providers alike use various antenna reception testing methods to locate a reception antenna at a destination. The antenna reception tests test signal strength and quality of their antenna networks to determine how to better supply the destination with service. These methods are typically arduous and dangerous.

Presently, to properly place an antenna at the destination site, manual work must be performed by a technician. Notably, placement of the antenna typically requires that a technician be elevated to dangerous heights by an aerial lift truck. Simultaneously, the technician must manage both cables and equipment that are used to determine the best height and location for reception antenna placement. This requires many technicians, heavy machinery, and it can take anywhere from one to five hours to complete. Further, these tests are performed on a regular basis, making them costly to the companies that must perform them.

As noted, these antenna reception testing methods are timely, costly, and unsafe for technicians. Due to the nature of the conventional reception antenna testing, insurance is costly. Also, the conventional antenna reception testing methods require costly man hours, heavy equipment, maintenance, and a considerable time to run the tests. Further, the heavy equipment that is used has limitations when trying to determine an optimal placement of the reception antenna.

BRIEF DESCRIPTION OF THE DRAWINGS

The disclosure can be better understood referencing the following drawings. The elements of the drawings are not necessarily to scale relative to each other, emphasis instead being placed upon clearly illustrating the principles of the disclosure. Furthermore, like reference numerals designate corresponding parts throughout the several views.

DETAILED DESCRIPTION

This present disclosure relates to an exemplary system for determining an optimal location for the installation of a reception antenna in accordance with an embodiment of the present disclosure. In one embodiment, the system determines the optimal location of the reception antenna so that adequate service is provided to a residential building, a commercial building, or any other type of building or structure for which wireless service is desired.

The system comprises a user device, an unmanned aerial vehicle (UAV), and a wireless interne service provider (WISP) tower. In an autonomous embodiment, the user initiates tests to be performed by the UAV via the user interface device that may include an azimuth test, an altitude test, or a complete test. The azimuth test provides the user an azimuth at which adequate signals are received from the WISP tower. The altitude test provides the user an altitude or altitude range at which adequate signals are received from the WISP tower at a given azimuth. The complete test provides both the azimuth and the altitude or altitude range at which adequate signals are received from the WISP tower. These tests are described further herein. The outcome of the tests performed provide the user an optimal location at which to install a reception antenna so that the building for which wireless services are desired receives adequate wireless services. In the autonomous embodiment of the system, the UAV flies autonomously when performing the aforedescribed tests.

In a manual embodiment, the user of the UAV may have already obtained azimuth and altitude or altitude range information indicating at what direction and at what altitudes adequate signals are received from the WISP tower. In such an embodiment, the user may control flight of the UAV via the user device and fly the UAV at or around the building or structure to determine where on or around the building or structure a reception antenna may be erected that provides adequate wireless services, based upon signals received from the WISP tower.

Additionally, the system of the present disclosure may be used to determine an open channel for desired frequencies when erecting a new WISP tower. In this regard, the UAV scans a pre-selected frequency range and locates channels that exist at a location. Based upon data received, a user of the system can select a desired frequency and channel that can be used that will not be interfered with by surrounding WISP towers when erecting a WISP tower.

Figure 1:
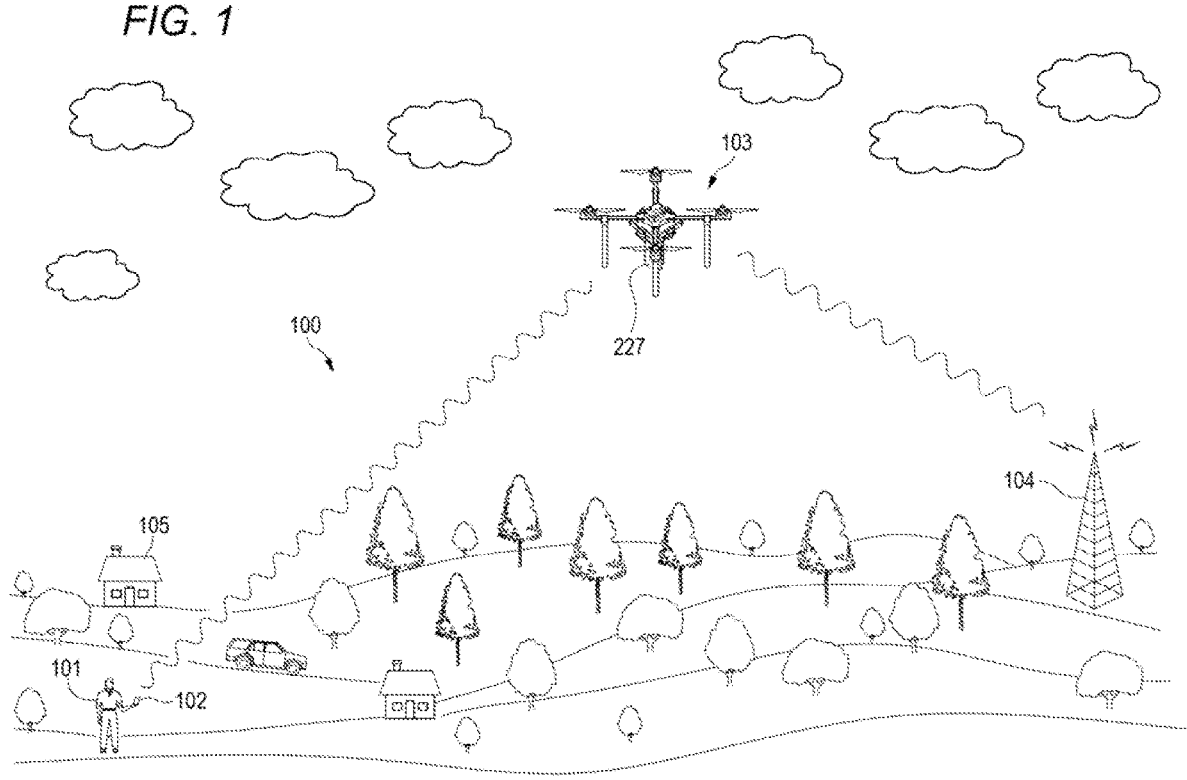
FIG. 1 is a landscape view of a system for determining an optimal location for the installation of a reception antenna in accordance with an embodiment of the present disclosure.

FIG. 1 depicts an exemplary system 100 for determining an optimal location for the installation of a reception antenna in accordance with an embodiment of the present disclosure. The system 100 comprises a user interface device 102, a UAV 103, and a WISP tower 104. Note that a third-party antenna module 227 is removeably coupled to the UAV 103 for detecting signals from the WISP tower 104.

The user interface device 102 may be any type of device that is configured for communicating with and controlling the UAV 103 by a user 101. As mere examples, the user interface device 102 may be a cell phone, a lap top computer, a tablet, or any other type of device configured for communicating with the UAV 103. In this regard, the user interface device 102 is configured for transmitting data to the UAV 103 and receiving data from the UAV 103. This method is described further herein. Note that in one embodiment a universal serial bus (USB) controller (not shown) may be connected to the user interface device 102 for controlling operation of the UAV 103.

In an autonomous mode, the user 101 initiates the aforementioned tests to be performed by the UAV 103 wherein the tests determine the optimal azimuth and altitude of signal reception from the WISP tower 104 that would provide a building 105 with optimal wireless service. The user 101 may then use the azimuth and altitude information to erect a reception antenna for the provision of wireless services to the building 105.

In a manual mode, the user 101 uses the optimal azimuth and altitude or altitude range of signal reception that would provide the best services to the building 105, which may have been obtained from the azimuth test, the altitude test, and/or the complete test identified above. In using this information, the user 101 controls the azimuth and altitude of the UAV 103 and manually flies the UAV 103 near or around the building 105 to determine the most effective and/or convenient placement of the reception antenna.

Note that the UAV 103 is any type of unmanned aerial vehicle that can be controlled by the user interface device 102. The UAV 103 is configured for receiving signals via the third-party antenna module 227 coupled to the UAV 103 from the WISP tower 104 and recording antenna data associated with an azimuth and altitude or altitude range indicative of signals received. Note that adequacy of a signal is determined by the signal strength, the signal capacity or bandwidth and the quality of the signal received. Quality of the signal received is determined by testing whether the signal received includes all the information that was originally sent by the WISP tower 104. For example, the signal may indicate that five (5) data packets were sent by the WISP tower 104. Thus, a signal with good quality will contain all five (5) packets that were originally sent by the WISP tower 104.

Note that in one embodiment, the user interface device 102 may communicatively couple to the UAV 103 via a dongle on the UAV 103 that has an antenna and that allows access to wireless broadband. In this regard, the antenna is configured for receiving signals from the user interface device 102 and transmitting signals to the user interface device 102.

Note that in one embodiment, the UAV 103 comprises at least two antennas. One antenna is configured for receiving signals from the WISP tower 104. The second antenna is configured for communicating with the user interface device 102. The first and second antennas are configured at different frequencies so that the first and second antennas do not interfere one with the other.

Figure 2:
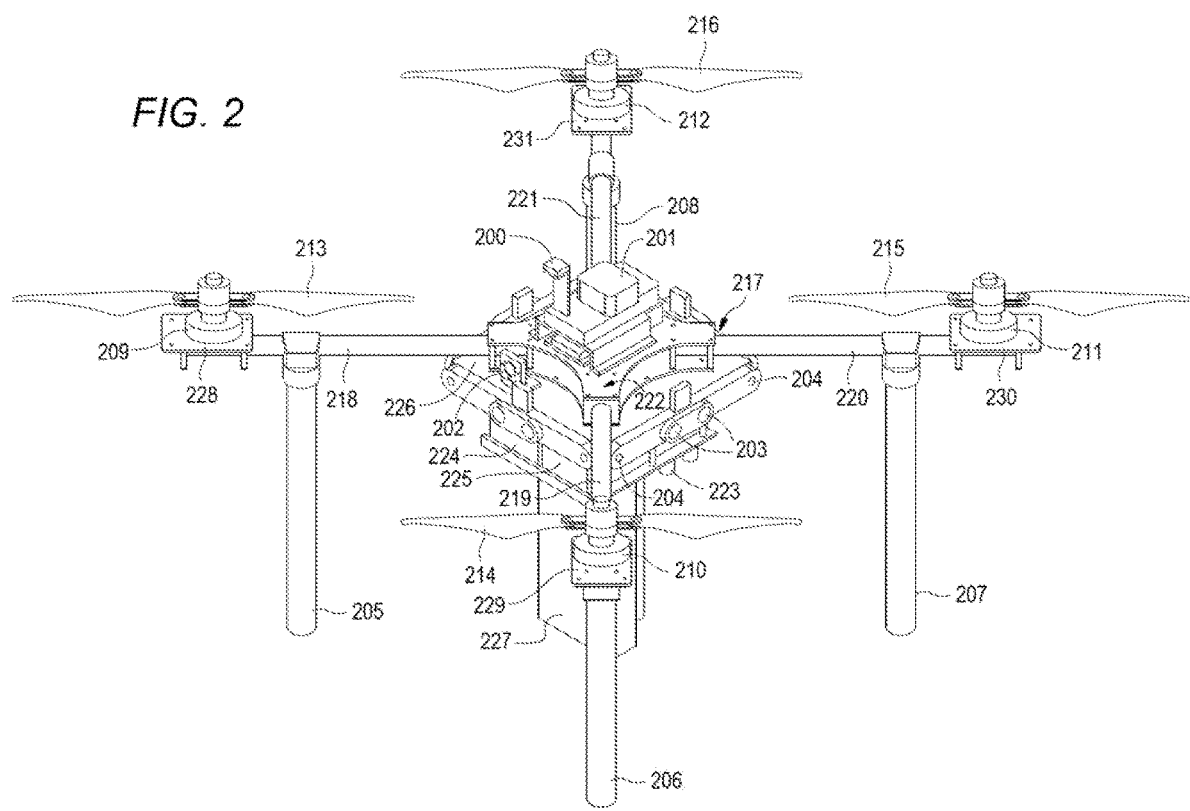
FIG. 2 is a perspective view of an exemplary unmanned aerial vehicle (UAV) as shown in FIG. 1.

FIG. 2 is a diagram of an exemplary structure of the UAV 103 in accordance with an embodiment of the present disclosure. The UAV 103 comprises a frame 217 that may be coupled to a protective cover; however, a protective cover is not shown in FIG. 2 to show the various viewable hardware components of the UAV 103 that would be hidden by the protective cover.

The UAV 103 comprises a global positioning system (GPS) 200. The GPS is configured for determining positions of the UAV 103 during flight.

Further, the UAV 103 comprises a flight controller 201. The flight controller 201 is configured for flying the UAV 103 either autonomously or manually. Note that when flying autonomously, the flight controller 201 may fly the UAV 103 in accordance with a predetermined flight plan. When flying manually, the flight controller 201 flies the UAV in response to commands sent to the UAV 103 by the user 101 (FIG. 1) using the user interface device 102 (FIG. 1).

Attached to the frame 217 is a star-shaped structure 222 for coupling to and positioning a plurality of arms 218-221. These arms 218-221 extend from each side of the structure 222. Each arm 218-221 is positioned at a ninety-degree angle from each of the other arms 218-221.

Each arm 218-221 is coupled to a corresponding leg 205-208, respectively. The legs 205-208 are configured to maintain the UAV 103 upright when the UAV 103 is on the ground or other flat surface.

Motors 209-212 are coupled at the end of each arm 218-221, respectively. The motors 209-212 are controlled by electronic speed controllers (ESC) 228-231, respectively. The ESCs 228-231 are controlled by the flight controller 201 and are configured to rotate a plurality of propellers 213-216 based upon data received from the flight controller 201 to move the UAV 103 to different locations and/or positions.

The UAV 103 further comprises a camera 202. The camera 202 records images, including still images and video, during operation of the UAV 103. As will be described further, data indicative of the still images and video captured by the camera 202 may be transmitted to the user interface device 102 in real-time to show surroundings of the UAV 103 as signals are detected by the antenna module 227. Further, data indicative of the still images and video may also be stored by the UAV 103.

The UAV 103 further comprises sonar detectors 203. The sonar detectors 203 are on each side of the UAV 103. The sonar detectors 203 detect distances from objects near the UAV 103. Data indicative of this distance are used by the UAV 103 to avoid collisions with the objects.

Additionally, the UAV 103 comprises a plurality of stereo cameras 204, including two stereo cameras 204 at each corner of the UAV frame 217. The stereo cameras 204 capture three-dimensional images via stereo photography and determines distances from objects near the UAV 103. Data indicative of the distances are used by the UAV 103 to avoid collisions.

Further coupled to the frame 217 are two batteries 224 and 225. The batteries 224 and 225 provide power to the UAV I 03 during operation. In one embodiment, the batteries 224 and 225 are rechargeable.

Further, the UAV 103 comprises the third-party antenna module 227. The third-party antenna module 227 is detachably coupled to the UAV 103. Note that an internet service provider (ISP) couples the third-party antenna module 227 to the UAV 103. The third-party antenna module 227 is configured to detect signals related to a predetermined service set identifier (SSID) identifying a particular WISP tower. The S SID identifies the WISP tower I04 (FIG. I) from which the third-party antenna module 227 receives signals, and in this regard, the SSID is predetermined by the third-party and programmed into the third-party antenna module 227. The third-party antenna module 227 receives signals from the WISP tower 104 and detects and records signal strengths, signal capacities, and signal qualities, which the UAV 103 stores as antenna data.

Figure 3:
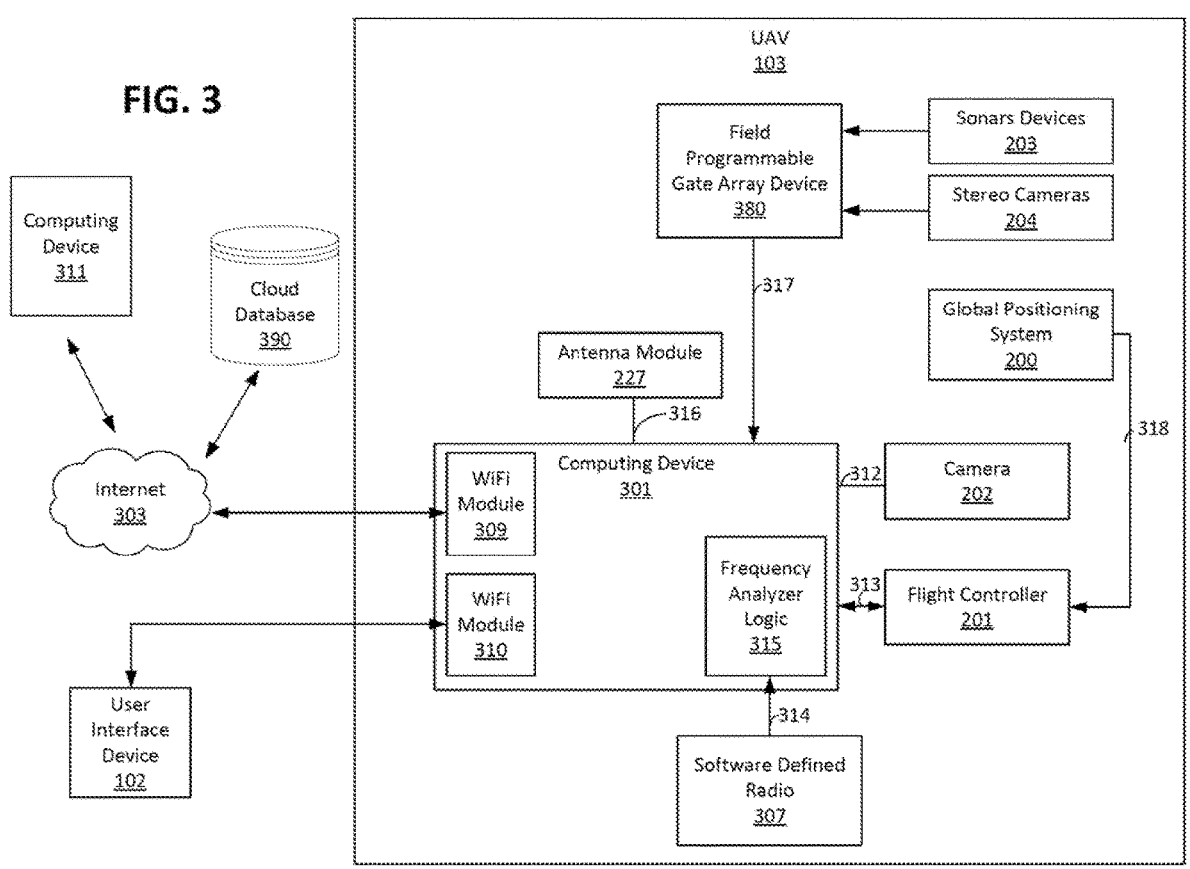
FIG. 3 is a block diagram of a computing device of the UAV as shown in FIG. 2 with two user interface devices coupled thereto.

FIG. 3 is a block diagram showing exemplary architecture of the UAV 103 depicted in FIG. 1. Additionally, FIG. 3 depicts the user interface device 102 communicatively coupled to the UAV 103 and a computing device 311 communicatively coupled to the UAV 103 via an Internet 303. Further shown is a cloud database 390.

The user interface device 102 and the computing device 311 are configured to communicate with the UAV 103, which is described further herein. Note that the computing device 311 may be any type of device for connecting to the Internet 303, for example a personal computer, a laptop computer, a handheld device, or a tablet.

The cloud database 390 is for storing data received from the UAV 103 and providing the stored data to a user of the computing device 311. Additionally, the cloud database 390 is configured to receive data from the user of the computing device 311. In this regard, flight data related to the flight of the UAV 103 may be streamed in real-time to the cloud database.

The UAV 103 comprises a computing device 301, the third-party antenna module 227, a software defined radio 307, and a field programmable gate array device 380. Additionally, the UAV 103 comprises the plurality of sonar devices 203, the GPS 200, a plurality of stereo cameras 204, the camera 202, and the flight controller 201.

Further, the computing device 301 comprises two separate and distinct wireless fidelity (Wi-Fi) modules, including Wi-Fi module 309 and Wi-Fi module 310. The Wi-Fi module 309 is any type of device that comprises a transceiver (not shown) for sending and receiving data. In one embodiment, the Wi-Fi module 309 is communicatively coupled to the Internet 303 and streams data in real-time through Wi-Fi module 309 to a user of the computing device 311 via the cloud database 390. In this regard, data collected and/or used by the UAV 103 may be viewed by a user of the computing device 311 in a graphical user interface (GUI) (not shown). Note that in some embodiments, the user may also be able to control aspects of the UAV 301, such as, for example controlling the UAV 103 flight path. In one embodiment, the Wi-Fi module 309 connects to the interne via either 2.4 Gigahertz (Ghz) or 5 Ghz. However, other frequencies may be used in other embodiments.

The Wi-Fi module 310 is configured as an access point and is any type of device that comprises a transceiver (not shown) for sending and receiving data. In one embodiment, the Wi-Fi module 310 is communicatively coupled to the user interface device 102. The data collected and/or used by the UAV 103 may be viewed by the user 101 (FIG. 1) of the user interface device 102 in a GUI (not shown). In this regard, the UAV 103 may transmit data from the camera 202 to the GUI showing the surroundings of the UAV 103. Further, the UAV 103 transmits signal data, altitude, and azimuth data to the user 101 in the GUI. The GUI is also configured to allow the user 101 to select how the user 101 desires to operate the drone, e.g., through autonomous or manual mode. Note that the UAV 103 may transmit real-time data or saved data to the GUI. Note that in manual mode, the user 101 of the user interface device 102 may also control the UAV 103, such as, for example controlling the UAV 103 flight path. In one embodiment, the Wi-Fi module 310 connects to the user interface device 102 via either 2.4 Ghz or 5 Ghz. However, other frequencies may be used in other embodiments.

Note that in one embodiment, the Wi-Fi modules 309 and 310 are Wi-Fi cards that are coupled to the computing device 301. However, other types of Wi-Fi modules 309 and 310 may be used in other embodiments.

The UAV 103 further comprises a camera 202 The camera 202 is configured for capturing data indicative of video or still images within the field of view of the camera 202. Data indicative of video or still images of the UAV 103 in the field of view of the camera 202 may be displayed to a user of the computing device 311 via the cloud database 390 or the user 101 (FIG. 1) of the user interface device 102, as will be described further herein. Note that the camera 202 may be a 5 mega pixel camera in one embodiment. However, other types of cameras may be used in other embodiments of the present disclosure. In one embodiment, the UAV 103 is configured for collecting still images in the field of view of the camera 202 when an adequate radio signal is received from the WISP tower 104 (FIG. 1) so that the user can analyze how the surrounding environment might affect the signal strength.

The UAV 103 further comprises a flight controller 201. The flight controller 201 is communicatively coupled to the computing device 301 via an electrical connection 313. The flight controller 201 is also electrically coupled to the flight hardware, including the ESCs 228-231 (FIG. 2). Thus, the flight controller 201 can send signals to the UAV ESCs 228-231, which control the motors 209-212 (FIG. 2) to guide and fly the UAV 103. Note that the flight controller 201 directs the rotation-per-minute of the motors 209-212 through the ESCs 228-231 of the UAV 103 in response to input, which can be in the form of a predetermined flight plan or in response to a user's input via the user interface device 102.

The UAV 103 further comprises a software-defined radio 307, which is communicatively coupled to the computing device 301 via an electrical connection 314. In one embodiment, the software-defined radio 307 scans frequency bands for analysis by frequency analyzer logic 315 of the computing device 301, which is described further herein. Note that a software-defined radio is a radio that is implemented in software only with no hardware traditionally used in radios, e.g., mixers, filters, amplifiers, modulators/demodulators, detectors, etc.

The field programmable gate array (FPGA) device 380 is communicatively coupled to the sonar devices 203 and to the computing device 301 via electrical connection 317. In operation, the sonar devices 203 transmit data indicative of distances of objects that are near the UAV 103. The FPGA device 380 compresses data received from the sonar devices 203 and provides the compressed data to the computing device 103.

Further, the FPGA device 380 is communicatively coupled to the stereo cameras 204 and to the computing device 301 via the electrical connection 317. In operation, the stereo cameras 204 transmit data indicative of the distance of the UAV 103 to objects near the UAV 103. The FPGA device 380 compresses the data received from the stereo cameras 204 and provides the compressed data to the computing device 103.

The GPS 200 is communicatively coupled to the flight controller 201. Thus, data obtained by the GPS 200 is transmitted through the flight controller 201 to the computing device 301. The GPS 200 is configured to capture data indicative of the location of the UAV 103 during flight of the UAV 103. This location data may include the latitude, longitude, and altitude of the UAV 103. Further, the data may include azimuth data indicating in what direction the UAV 103 is pointing while the antenna module 227 is detecting signals.

In one embodiment, the cloud database 390 stores data indicative of maps corresponding to the area in which the UAV 103 is to be flown. In such an embodiment, a user of the computing device 311 may enter data on a map indicating existing locations of WISP towers. When the Wi-Fi module 309 connects to the computing device 301, location data indicative of the locations of the towers is uploaded to the computing device 301. This location data of the towers may then be used by a user 101 of the user interface device 102 to determine the location of the UAV 103 in relation to one of the existing towers. This is described further herein.

Additionally, the flight data defining a flight of the UAV 103 is downloaded to the cloud database 390. In operation, a user of the computing device 311 may pull up a map stored in the cloud database 390, and the user may view the flight of the UAV 103 on the map.

Figure 4:
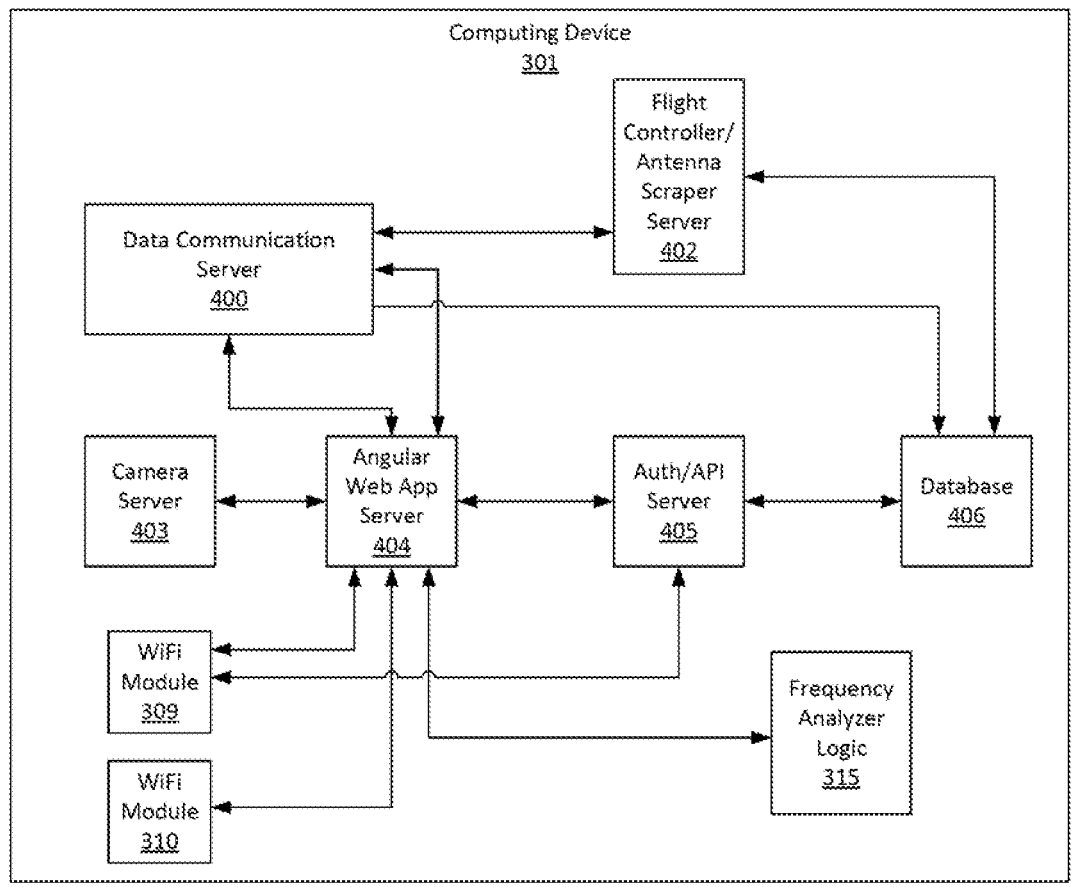
FIG. 4 is a block diagram of the exemplary computing device as shown in FIG. 3 further showing exemplary computer modules in accordance with an embodiment of the present disclosure.

FIG. 4 is a block diagram of an exemplary computing device 301 as shown in FIG. 3. The computing device 301 comprises a variety of components for operating the UAV 103 and various aspects of the functionality of the system 100 (FIG. 1).

Notably, the computing device 301 comprises an angular Web application server 404. The angular Web application server 404 is configured to generate a GUI (not shown) that is displayed to the user interface device 102 (FIG. 3) during operation of the system 100 via the Wi-Fi module 310. Further, the angular Web application server 404 is configured to generate a GUI that is displayed to the computing device 311 (FIG. 3). The GUIs and their functionality on the user interface device 102 and the computing device 311 are hereinafter referred to as the "angular application." Through the angular application, the user 101 (FIG. 1) of the user interface device 102 or the user of the computing device 311 may manipulate and access the UAV 103 (FIG. 1). In this regard, the user 101 (FIG. 1) of the user interface device 102 and the user of the computing device 311 can initiate tests and manually control the flight of the UAV 103 through the user interface device 102 and the computing device 311, e.g., a computer, a laptop, a smartphone, a tablet, or any other type of user interface device. Note that the angular Web application server 404 is any type of server application that is configured to generate and display GUIs to the user interface device 102 and the computing device 311 and receive data indicative of user input into the angular application.

The angular Web application server 404 further communicates with an authentication and application program interface (API) server 405. The authentication and API server 405 is configured to authenticate a user through the angular Web application server 404 and provide API services to the angular Web application server 404. In operation, the user 101 of the user interface device 102 enters identifying information, e.g., a username and a password. In response, the authentication and API server 405 queries a database 406 to determine that the user of the user interface device 102 is using an authentic username and correct password associated with the username. Note that the angular Web application server 404 may communicate with the authentication and API server 405 through Representational State Transfer (RESTful) architecture; however, other architectures may be used in other embodiments.

Additionally, the authentication and API server 405 connects the Wi-Fi module 309 to the Internet 303 (FIG. 3). When connected, the authentication and API server 405 can download software updates and change user permissions in the database 406 by a user of the computing device 311. Further, the user of the computing device 311 may also be authenticated via a username and password verification via the authentication/API server 405.

The angular Web application server 404 also communicates with the authentication and API server 405 with other requests. As mere examples, the angular Web application server 404 may request frequency scanning by the frequency analyzer logic 315, connecting to Wi-Fi networks, downloading license and user files, or downloading software updates. Upon such request, the authentication and API server 405 performs the actions requested. Note that licenses, user files, and software updates may be stored in the database 406, which the authentication and API server 405 may download.

Note that in one embodiment, the user interface device 102 enables access of the computing device 311 to the UAV 103 by directing the Wi-Fi module 309 to connect to the Internet. In this regard, via the GUI the user enters data that commands the Wi-Fi module 309 to connect to the Internet 303 (FIG. 3) through the angular Web application server 404. Once the Wi-Fi module 309 connects to the Internet, the SSID of the Wi-Fi access point to which 309 connects is stored locally. Thus, thereafter when the UAV 103 is powered near the Internet Wi-Fi module 309, the UAV 103 will connect and provide updates automatically to the cloud database 390.

The computing device 301 further comprises a data communication server 400. The data communication server 400 is communicatively coupled to the flight controller/antenna scraper server 402 and the angular Web application server 404. In operation, the data communication server 400 is configured for managing large, lossy data related to the UAV 103. In this regard, the data communication server 400 streams large amounts of flight data, flight commands and antenna data obtained from the flight controller/antenna scraper server 402 to the angular application executing on the user interface device 102 (FIG. 3) and flight commands from the user interface device 102.

The flight controller/antenna scraper server 402 is communicatively coupled to the flight controller 201 (FIG. 3), the antenna module 227 (FIG. 3), the FPGA 380, and the data communication server 400. In this regard, the flight controller/antenna scraper 402 receives antenna data from the antenna module 227 (FIG. 3), the flight controller 201, and the FPGA 380.

The flight controller/antenna scraper server 402 performs functions related to the UAV 103. For example, the flight controller/antenna scraper server 402 collects data from the antenna module 227, which can be transmitted through the data communication server 400 to the angular application running on the user interface device 102 or the cloud database 390. The data collected from the antenna module 227 can be displayed to the user 101 via the user interface device 102. Also, a user of the computing device 311 may also access the data collected from the antenna module 227 on the cloud database 390.

Also, the flight controller/antenna scraper server 402 can access the flight controller 201 to control movement of the UAV 103 as dictated autonomously by a predetermined flight plan or provided manually by the user interface device 102. Further, the flight controller/antenna scraper server 402 can further receive data through from the flight controller 201 related to the flight of the UAV 103.

Note that in manual mode, the flight controller/antenna scraper server 402 receives the commands for flying the UAV 103 from the data communication server 400. In such an embodiment, the flight controller/antenna scraper server 402 converts the commands received using open-source Drone core for PX4 to an appropriate Dronecore command that is provided to the flight controller 201 to control the flight of the drone.

Also, the flight controller/antenna scraper server 402 can transmit flight data through the data communication server 400 to the user interface device 102. This flight data can then be displayed on the angular application running on the user interface device 102. This flight data includes azimuth, altitude, latitude, and longitude information obtained from the GPS 200 (FIG. 3) that is coupled to the flight controller/antenna scraper server 402 through the flight controller 201.

Also, the flight controller/antenna scraper server 402 can transmit flight data through the data communication server 400 to the cloud database 390. This flight data can then be displayed on the angular application running on the computing device 311. This flight data includes azimuth, altitude, latitude, and longitude information obtained from the GPS 200 (FIG. 3) that is coupled to the flight controller/antenna scraper server 402 through the flight controller 201.

Further, the flight controller/antenna scraper 402 receives data from the FPGA 380 indicative of data received from the sonars 203 (FIG. 3) and the stereo cameras 204 (FIG. 3). The data received indicates distances to object(s) near the UAV 103. In response, the flight controller/antenna scraper 402 may automatically maneuver the UAV 103 via the flight controller 201 (FIG. 3) to avoid colliding with objects near the UAV 103. This method works in both an autonomous mode and a manual mode of flying the UAV 103.

In addition, the computing device 301 comprises a camera server 403 that is communicatively coupled to the camera 202 (FIG. 3). Further, the camera server 403 is communicatively coupled to the angular Web application server 404. In operation, the camera 202 captures data indicative of video and still images of the UAV's surroundings. The camera server 404 captures the data and through the angular Web application server 303, data indicative of the images is transmitted to the user interface device 102 through the Wi-Fi module 310. The angular application executing on the user interface device 102 can display video or images to the user 101 while the UAV 103 is in flight. Further, the data indicative of the images may be transmitted to the cloud database 390, which is accessible by the computing device 311.

The frequency analyzer logic 315 is communicatively coupled with the software defined radio 307 (FIG. 3). In operation, a user may desire to determine what channels are available on a particular frequency to determine on which channel to place a WISP tower. To make this determination, a user 101 of the user interface device 102 enters a frequency or frequency range into the angular application running on the user interface device 102. The frequency analyzer logic 315 receives data indicative of the frequency or frequency range from the angular Web application server 404. Through the software defined radio, the frequency analyzer logic 315 scans an area searching for channels that are operating at the identified frequency. After the location of the channels, the frequency analyzer logic 315 transmits data indicative of the channels located to the user 101 through the angular application running on the user interface device 102.

As described herein, in one embodiment, the user may enter existing tower locations on a map stored on the cloud database 390. When the Wi-Fi Module 309 connects to the Internet 303 (FIG. 3), the cloud database 390 downloads the data indicative of the tower locations to the database 406. During operation of the UAV 103, the flight/controller antenna scraper 402 compares the current location of the UAV 103 to the data indicative of the locations of the towers. The flight/controller antenna scraper 402 determines, for example, the distance of the UAV 103 to the one or more tower locations and the azimuth at which the UAV 103 should be maneuvered to point to the one or more of the towers. The flight/controller antenna scraper 402 transmits data through the data communication server 400 and the angular Web Application server 404 to the user device 102 (FIG. 3). The angular application displays to the user 101 how far the UAV 103 is from the one or more towers and displays to what azimuth the UAV 103 is to be maneuvered to point to the one or more towers.

Additionally, as described herein the user of the computing device 311 can view a flight of the UAV 103 on a map. In this regard, a map of the area of the flight is stored on the cloud database 390 (FIG. 3). As indicated herein, data indicative of a flight of the UAV 103 is downloaded to the cloud database 390 when the Wi-Fi module 309 connects to the Internet. The data indicative of a flight of the UAV 103 is interposed on the map, and the user of the computing device 311 can view the flight of the UAV 103 on the map.

Figure 5:
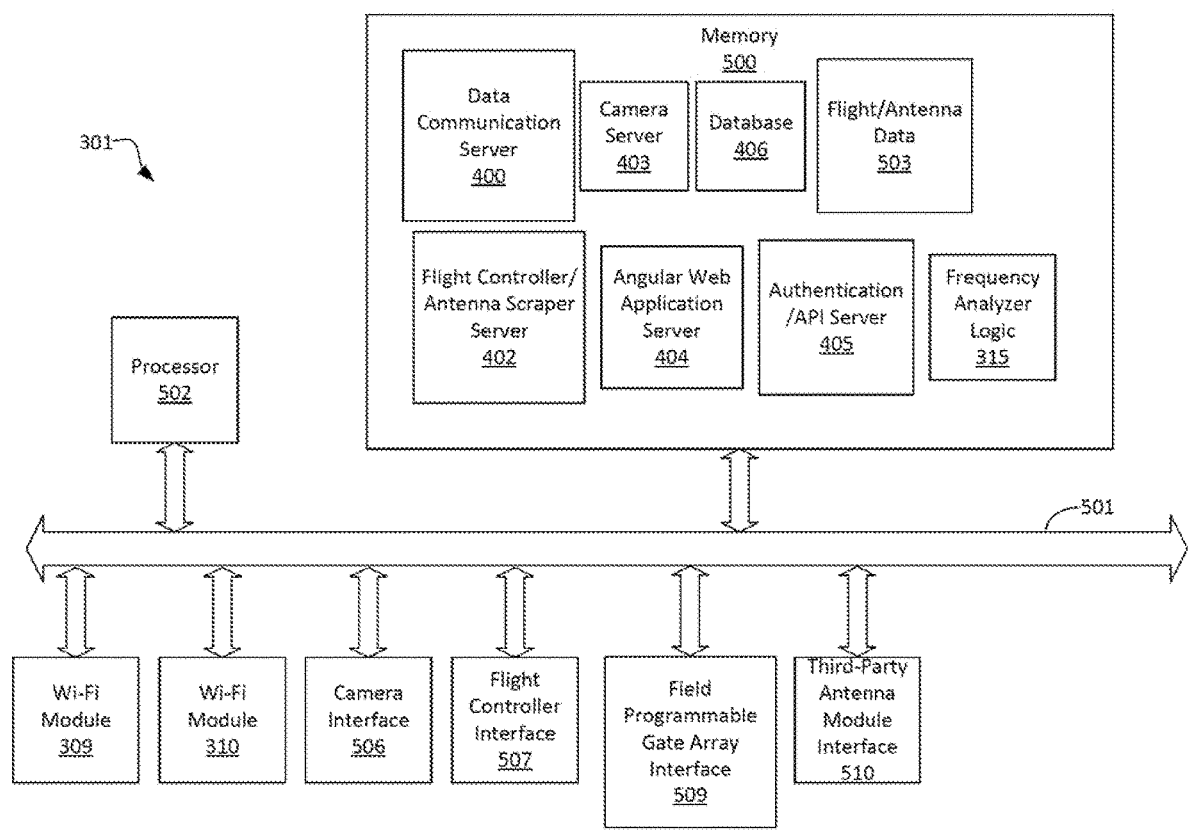
FIG. 5 is a block diagram of the exemplary computing device and exemplary computer modules shown in FIG. 4 further showing exemplary interfaces to hardware components of the UAV as shown in FIG. 2.

FIG. 5 is a block diagram of the computing device 301 in accordance with an embodiment of the present disclosure. As shown in FIG. 5, the computing device 301 comprises a processor 502, a Wi-Fi module 309, and a Wi-Fi module 310. Further, the computing device 301 comprises a camera interface 506 that couples the computing device 301 to the camera 202 (FIG. 3), a flight controller interface 507 that couples the computing device 301 to the flight controller 201 (FIG. 3), an FPGA interface 509 that couples the computing device 301 to the FPGA device 380 (FIG. 3), and a third-party antenna module interface 510 that couples the computing device 301 to the antenna module 277 (FIG. 3).

Further, the computing device 301 comprises memory 500. Memory 500 comprises the frequency analyzer logic 315, the data communication server 400, the camera server 403, the database 406, the flight/controller/antenna scraper 402, the angular Web application server 404, and the Authentication/AP! server 405. The components 315 and 400-406 may be hardware, software, or a combination thereof. In the embodiment shown in FIG. 5, the components 315 and 400-406 are shown as software stored in memory 500. Further stored in memory 500 is transient data, including flight/antenna data 503.

The exemplary embodiment of the computing device 301 depicted by FIG. 5 comprises at least one conventional processor 502, such as a Digital Signal Processor (DSP) or a Central Processing Unit (CPU), that communicates to and drives the other elements within the computing device 301 via a local interface 501, which can include at least one bus. Further, the processor 502 is configured to execute instructions of software, such as the frequency analyzer 315, the data communication server 400, the camera server 403, the flight/controller/antenna scraper 402, the angular Web application server 404, and the Authentication/AP! server 405.

Note that the frequency analyzer logic 315, the data communication server 400, the camera server 403, the flight/controller/antenna scraper 402, the angular Web application server 404, and the Authentication/AP! server 405, when implemented in software, can be stored, and transported on any computer-readable medium for use by or in connection with an instruction execution apparatus that can fetch and execute instructions. In the context of this document, a "computer-readable medium" can be any means that can contain or store a computer program for use by or in connection with an instruction execution apparatus.

The flight/antenna data 503 is data indicative of information received from the third-party antenna module 227 and the flight controller 201. In this regard, as the UAV 103 (FIG. 3) is operated and radio signals are received from the WISP tower 104 (FIG. 1), the flight controller/antenna scraper 402 receives data indicative of the information received from the third-party antenna module 227 and stores the data received from the third-party antenna module 227 as flight/antenna data 503. Note that the antenna data may be, for example, data indicative of the strength of signals, the capacity of the received signals, the quality of the received signals, and the corresponding azimuth and latitude information.

Further, during operation, the flight data of the UAV 103 is received via the flight controller interface 507. In this regard, the flight data comprises data indicative of GPS coordinates and azimuth of the UAV 103. The flight data is received then correlated with the antenna data received and stored as the flight/antenna data 503. Thus, each time antenna data is received, it is correlated with the position of the UAV 103 and stored as flight/antenna data 503.

Note that the flight data is any type of data indicative of the flight path of the UAV 103. The flight data 503 may include, for example, data obtained from the GPS 200 that indicates altitude, latitude, longitude, and azimuth of the UAV 103 during flight.

The frequency analyzer logic 315 is communicatively coupled to the software-defined radio 307 (FIG. 3) and is communicatively coupled to the angular Web application server 404 (FIG. 4). In operation, a user 101 of the user interface device 102 identifies a particular frequency. The frequency analyzer logic 315 then commands the software defined radio 307 to scan channels operating at the identified frequency. In this regard, the software defined radio 307 receives a plurality of radio signals from a plurality of towers operating at the identified frequency. Data indicative of the channels of the radio signals received is transmitted via the angular Web application server 404 to the user interface device 102. The user 101 (FIG. 1) of the user interface device 102 can then determine a frequency and channel to implement in the erection of a new WISP tower within the vicinity of the UAV 103.

Figure 6:
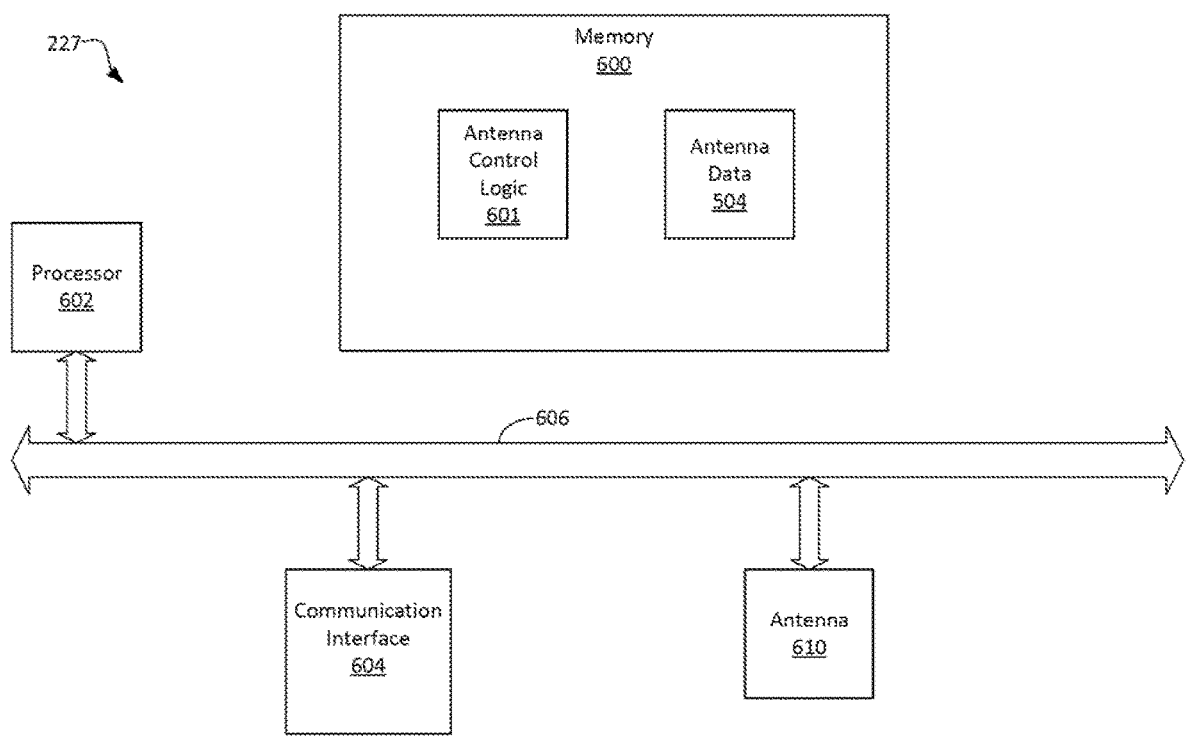
FIG. 6 is a block diagram of an exemplary antenna module as shown in FIG. 2.

FIG. 6 is a block diagram of an exemplary antenna module 227 in accordance with an embodiment of the present disclosure. As shown in FIG. 6, the exemplary antenna module 227 comprises a processor 602, a communication interface 603, an antenna 610, and memory 600. Memory 600 comprises the antenna control logic 601. The antenna control logic 601 may be hardware, software, or a combination thereof. In the embodiment shown in FIG. 6, the antenna control logic 601 is shown as software stored in memory 600. Further stored in memory 600 is transient data, including antenna data 504, as described hereinabove.

The exemplary embodiment of the antenna module 227 depicted by FIG. 6 comprises at least one conventional processor 602, such as a Digital Signal Processor (DSP) or a Central Processing Unit (CPU), that communicates to and drives the other elements within the antenna module 227 via a local interface 606, which can include at least one bus. Further, the processor 602 is configured to execute instructions of software, such as the antenna control logic 601.

Note that the antenna control logic 601, when implemented in software, can be stored, and transported on any computer-readable medium for use by or in connection with an instruction execution apparatus that can fetch and execute instructions. In the context of this document, a "computer-readable medium" can be any means that can contain or store a computer program for use by or in connection with an instruction execution apparatus.

The communication interface 604 is any type of device that connects the antenna module 227 to the computing device 301. In this regard, data may be transmitted through the communication interface 604 to the computing device 301.

The operation of the system 100 is now described. In operation, the UAV 103 may be operated in autonomous mode or manual mode. In autonomous mode, the UAV 103 performs at least three tests. These tests include an azimuth test, an altitude test, and a complete test. Each of these tests is now described.

An azimuth test is executed to determine an azimuth associated with a signal detected by the UAV 103 that exhibits. Note that to begin an azimuth test, the user 101 (FIG. 1) mounts an antenna module 227 (FIG. 2) to the UAV 103. The antenna module 227 is pre-configured to detect pre-selected signal strengths, e.g., −50 decibels to −75 decibels.

In executing the azimuth test, the user 101 selects a button in the angular application to begin the azimuth test. In response, the flight controller 201 flies the UAV 103 to a predetermined altitude, e.g., 100 feet. Once the UAV 103 is at the altitude, the drone spins three hundred and sixty degrees while collecting antenna data 605. Note that the term "adequate signal" indicates that the signal strength, the signal capacity, and the signal quality meet or exceed values such that if a reception antenna were installed at the location of the UAV 103, wireless services could be effectively provided to the building 105 (FIG. 1). If an adequate signal is not detected at the predetermined altitude, the antenna control logic 601 communicates with the flight controller/antenna scraper server 402 (FIG. 5) data indicating that an adequate signal was not detected. In response, the flight controller/antenna scraper 402 may transmit commands to the flight controller 201 (FIG. 3) to fly the UAV 103 to a different altitude. This process continues until an azimuth of an adequate signal is determined. Note that as antenna data 504 is collected, the antenna control logic 601 transmits data indicative of to the flight controller/antenna scraper server 402.

Once an adequate signal is detected, the flight controller/antenna scraper server 402 determines the azimuth of the UAV 103. Further, the flight controller/antenna scraper server 402 transmits data indicative of the azimuth at which the adequate signal was detected to the user interface device 102 (FIG. 1). Thus, the user 102 knows the azimuth associated with the strongest signal.

The user 101 may then perform an altitude test to determine the lowest point at which the strongest signal is detected at the identified azimuth. The user may then select an input button on the field user interface device 102 to run the altitude test at the azimuth detected.

In response to election of an altitude test, the UAV 103 flies to a height, which may be, for example, the maximum height allowed by law. The UAV 103 positions itself in accordance with the azimuth detected in the azimuth test, and the UAV 103 descends from the maximum height while continuously receiving radio signals from the WISP tower at the azimuth previously detected.

As the UAV 103 is descending, the flight controller/antenna scraper server 402 is receiving data indicative of the antenna data 504 detected by the antenna module 227. When the signal strength falls outside a range of acceptable signal strength, the capacity falls below a threshold capacity and/or the quality is affected, the flight controller/antenna scraper server 402 transmits data to the user interface device 102 indicative of the lowest point at which an antenna may be erected and still receive adequate signals from the WISP tower 104. In one embodiment, the flight controller/antenna scraper 402 transmits a range to the user interface device 102 in which the antenna may be erected.

Note that in one embodiment, when the azimuth of the strongest signal is detected, the camera server 403 (FIG. 4) may activate the camera 202 (FIG. 2) to obtain an image in the field of view of the camera where the strongest signal was detected.

The user may desire to do both the azimuth test and the altitude test in a single execution. This is hereinafter referred to as a "complete test," which includes both the azimuth test and the altitude test.

To do the complete test, the user 101 mounts the third-party antenna module 227 to the UAV 103. Upon selection by the user 101 through the field user interface device 102, the user 101 begins the complete test.

In response, the UAV 103 flies upward to a predesignated height, e.g., 100 feet. The UAV 103 rotates three hundred and sixty degrees until a signal is located having an acceptable signal strength. The UAV 103 then descends downward toward the ground at the azimuth of the acceptable signal strength to determine the lowest altitude at which a reception antenna may be erected for adequate service.

Note that if the UAV 103 makes its first rotation and finds no signal having adequate strength, it may ascend continuing to rotate until it finds a signal having adequate strength or until it ascends to the maximum height allowed by law. If no adequate signal is detected, the UAV 103 descends to the ground and reports to the user interface device 102 that no adequate signal was detected.

Figure 7:
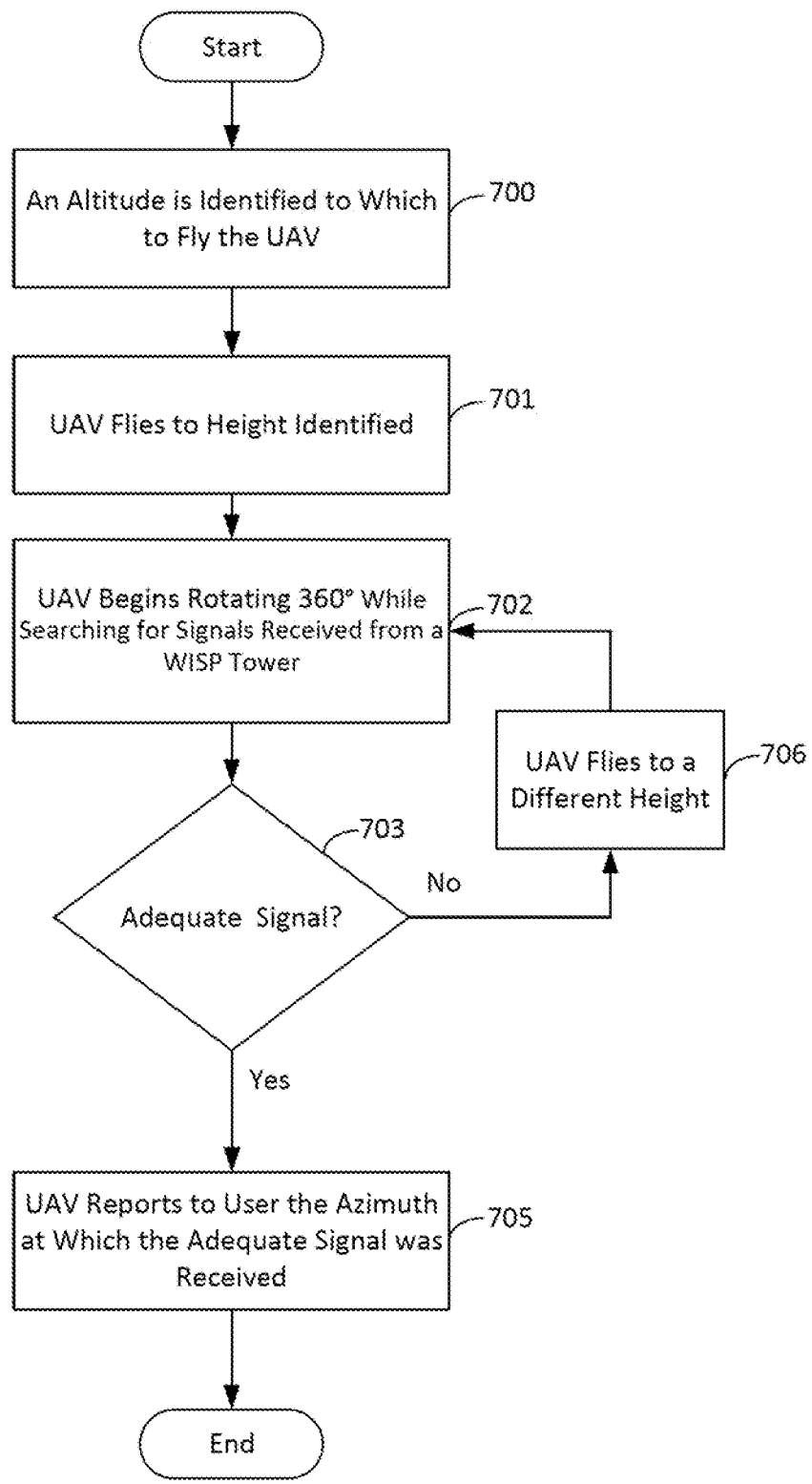
FIG. 7 is a flowchart exhibiting exemplary architecture and functionality of an azimuth test performed by the system as shown in FIG. 1 in accordance with an embodiment of the present disclosure.

FIG. 7 is a flowchart of exemplary architecture and functionality of the system 100 (FIG. 1) when performing an azimuth test.

In step 700, a height is identified to which to fly the UAV 103 (FIG. 1). This may be accomplished when the user enters data indicative of the height into the user interface device 102 (FIG. 1) or a height may be predetermined in performing the azimuth test.

In step 701, the flight controller 201 (FIG. 3) flies to the height identified. As an example, the user 101 may desire the UAV 103 begin listening for adequate signals at 100 feet. Thus, the user 101 enters 100 feet into the user interface device 102, and the UAV 103 flies up to 100 feet.

In step 702, the UAV 103 rotates 360° to detect an adequate signal. In step 703, if an adequate signal is detected, the flight controller/antenna scraper 402 (FIG. 5) transmits data indicative of the azimuth at which the adequate signal was received in step 705. Note that the adequacy of the signal is determined by the signal strength, the signal capacity or bandwidth and the quality of the signal received that is adequate for the provision of wireless services.

In step 703, if an adequate signal is not detected, UAV 103 maneuvers to a different height in step 706. In step 702, the UAV 103 rotates 360° to detect an adequate signal. This process is continued until an adequate signal is located. Once the adequate signal is located, the UAV reports the azimuth to the user at which the adequate signal was received.

Figure 8:
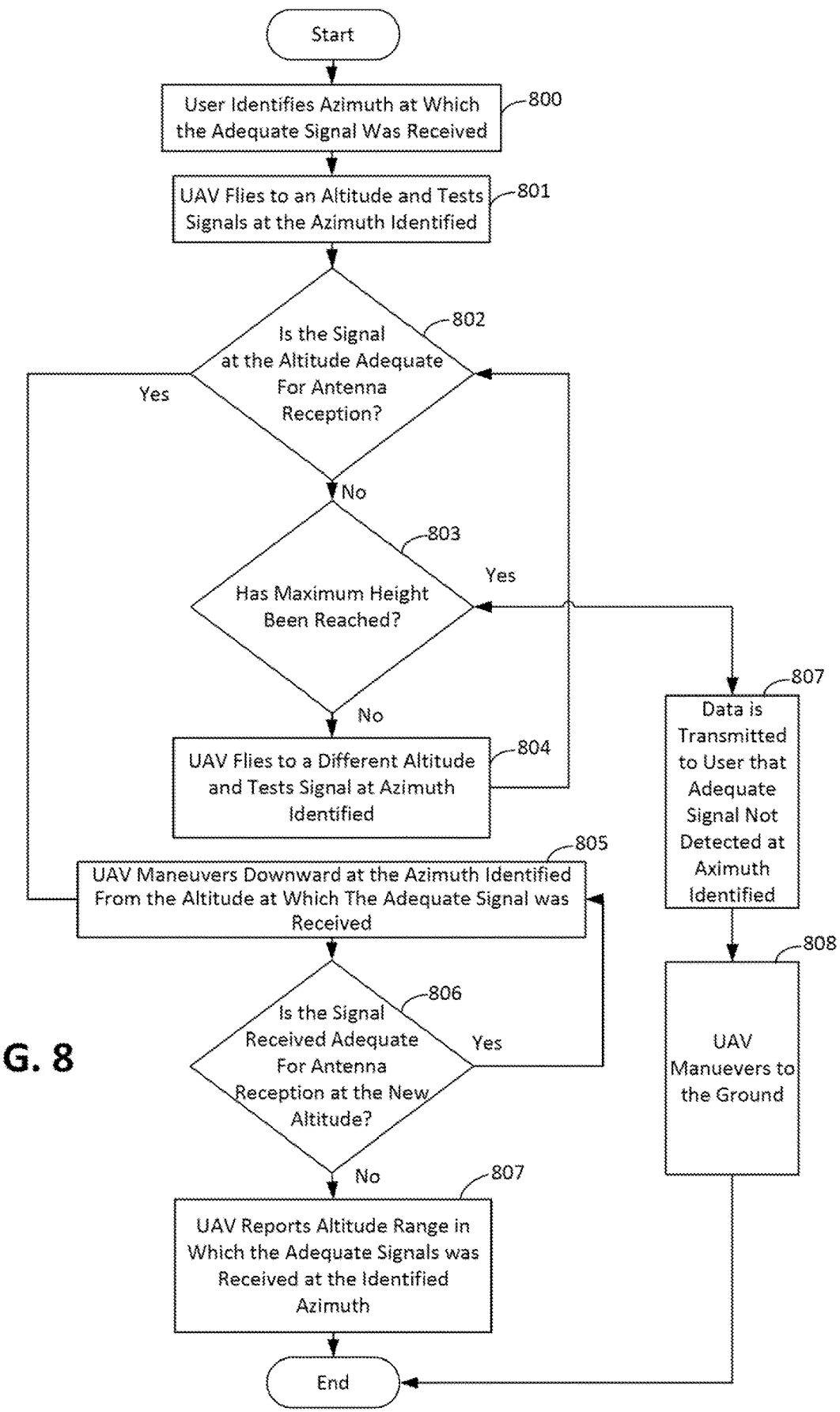
FIG. 8 is a flowchart exhibiting exemplary architecture and functionality of an altitude test performed by the system as shown in FIG. 1 in accordance with an embodiment of the present disclosure.

FIG. 8 is a flowchart of exemplary architecture and functionality of the system 100 (FIG. 1) when performing an altitude test.

In step 800, the user identifies an azimuth at which the adequate signal was received when performing the azimuth test via the user interface device 102 (FIG. 3). In step 801, the flight controller 201 (FIG. 3) files the UAV 103 (FIG. 3) to an altitude, e.g., 100 feet, at the azimuth identified and receives signals from the WISP tower 104 at the altitude and azimuth. If the antenna module 227 does not receive an adequate signal at the altitude in step 802 and the maximum height has been reached in step 803, the flight controller/antenna scraper transmits data to the user that an adequate signal could not be located at the azimuth identified in step 807. The flight controller 201 than maneuvers the UAV 103 to the ground If the maximum height has not been reached in step 803, the flight controller 201 flies to a different altitude and tests radio signals at the different altitude. If the signal received at the new altitude is adequate in step 802, the flight controller 201 maneuvers the UAV 103 downward at the azimuth identified from the altitude at which the adequate signal was received in step 805.

If the signal is adequate at the new altitude in step 806, the flight controller 201 continues to maneuver the UAV 103 downward to different altitudes in step 805. When a signal is received that is not adequate in step 806, the flight controller/antenna scraper 402 reports an altitude range in which adequate signals were received at the azimuth indicated to the user 101 (FIG. 1) of the user interface device 102 (FIG. 3).

Figure 9:
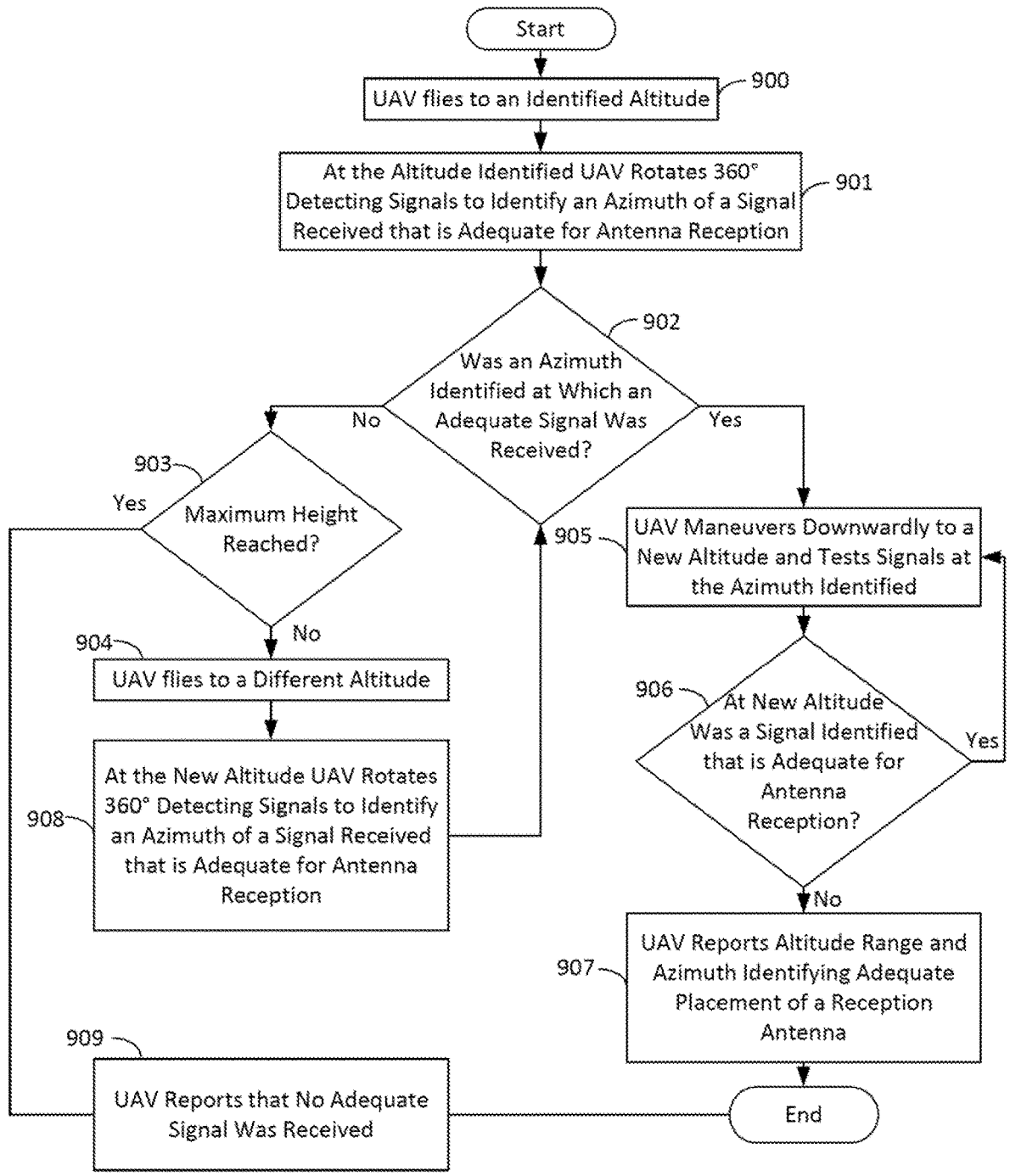
FIG. 9 is a flowchart exhibiting exemplary architecture and functionality of a complete test performed by the system as shown in FIG. 1 in accordance with an embodiment of the present disclosure.

FIG. 9 is a flowchart of exemplary architecture and functionality of the system 100 (FIG. 1) when performing a complete test.

In step 900, the flight controller 201 flies the UAV 103 (FIG. 3) to an identified altitude, e.g., 100 feet. At the altitude, the flight controller 201 rotates the UAV 103 360° to locate an azimuth at which an adequate signal is received in step 901.

If an azimuth was identified at which an adequate signal was received in step 902, the flight controller 201 maneuvers the UAV 103 downward to a new altitude and tests received signals at the azimuth identified. If the signal was adequate at the new altitude in step 906, the flight controller 201 continues to move the UAV 103 downward testing at each altitude whether the signal was adequate.

If the signal is not adequate in step 906, the flight controller 402 transmits data indicative of a report identifying an azimuth and reception range for placement of the reception antenna in step 907.

If in step 902 an azimuth is not identified at the altitude at which an adequate signal was received, and the maximum height has not been reached in step 903, the flight controller 201 flies the UAV 103 to a different Altitude in step 904. At the new altitude, the flight controller 201 rotates the UAV 103 360° to detect an azimuth at which an adequate signal is received in step 904. This process continues until the maximum height is reached in step 903 or an azimuth is identified at which an adequate signal was received in step 902.

Figure 10:
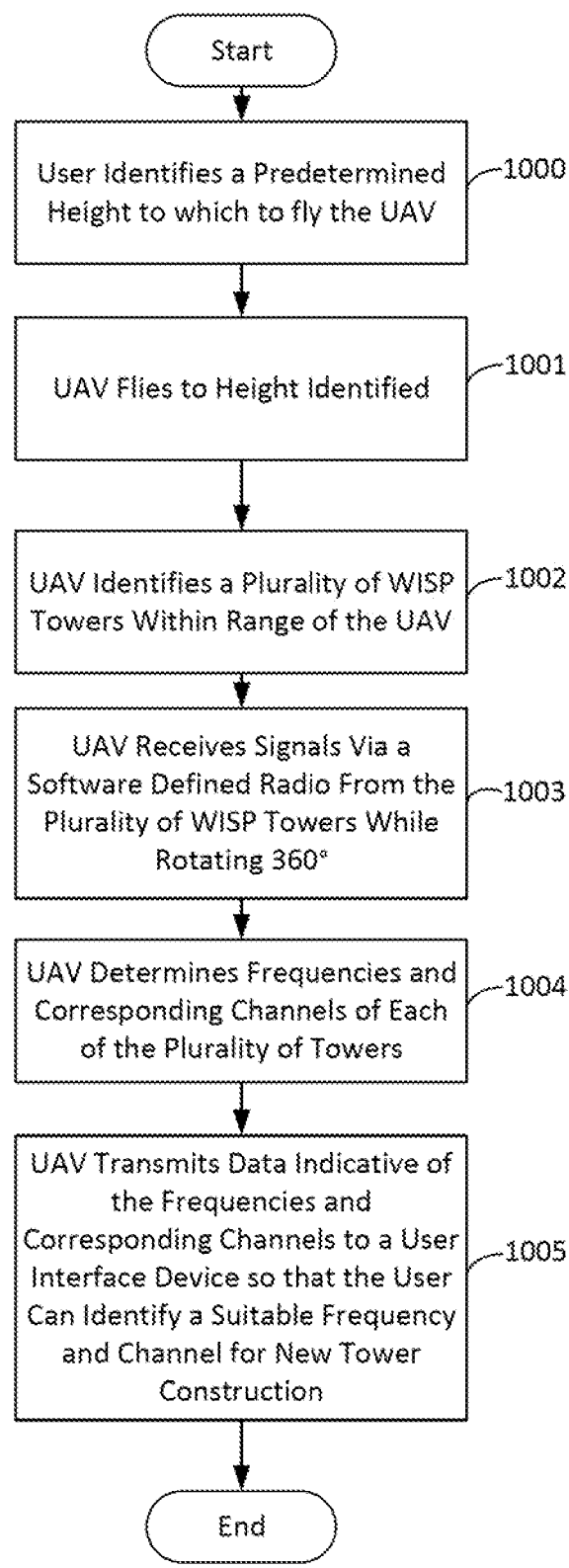
FIG. 10 is a flowchart depicting exemplary architecture and functionality of the exemplary unmanned aerial vehicle reception testing system as shown in FIG. 1 related to optimal frequency and channel selection for implementing a new wireless internet service provider (WISP) tower in accordance with an embodiment of the present disclosure.

FIG. 10 is a flowchart of exemplary architecture and functionality of the frequency analyzer logic 315 (FIG. 3).

In step 1000, the user 101 (FIG. 1) identifies a predetermined height to which to fly the UAV 103 (FIG. 3). The user 101 may enter data into the user interface device 102 specifying this height. In step 1001, the UAV 103 flies to the predetermined height.

In step 1002, the UAV 103 identifies a plurality of WISP towers within range of the UAV 103 and begins to receive signals from the plurality of WISP towers via the software defined radio 307 (FIG. 3) in step 1003.

In step 1004, the frequency analyzer logic 314 (FIG. 3) determines frequencies and channels of each of the plurality of WISP towers 104 based on the signals received. In step 1005, the UAV 103 transmits the data indicative of the frequencies and the corresponding channels to the user interface device 102. The user 101 may then use this information to determine a suitable frequency and channel for a newly erected WISP tower.

Figure 11:
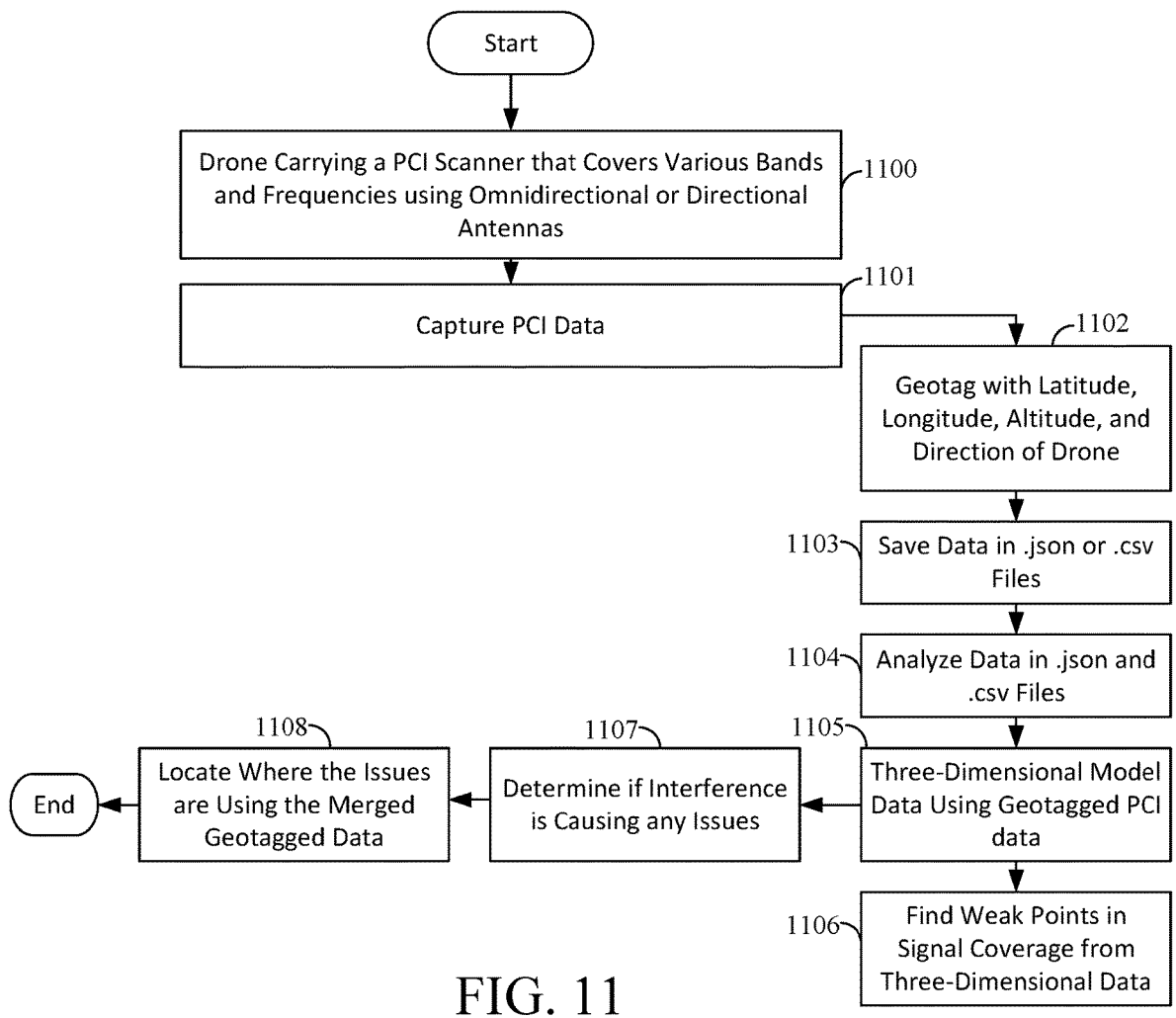
FIG. 11 is a flowchart depicting exemplary architecture and functionality of a drone carrying a physical cell identity (PCI) scanner.

With reference to FIG. 11, the UAV 103 may carry, in flight, a physical cell identity (PCI) scanner in step 1100. A PCI scanner tests network vulnerability. It is an automated, high-level test that finds and reports potential vulnerabilities in a network.

When PCI scanner covers 0-80 Giga Hertz Long Term evolution (0-80 GHz LTE). Note that telecommunications networks use several frequency bands with associated bandwidths. Further, the scanner covers 5-millimeter Wave (mmWave) frequencies using either omni directional or directional antennas in step 1100. The scanner captures the PCI data in step 1101 and each time a PCI data set is captured it is geotagged with latitude, longitude, altitude, and direction of the drone in step 1102. This data is saved in .json or .csv files for analyzation in step 1103 and step 1104.

The data is three-dimensional modeled using geotagged PCI data captures in step 1105 to find weak points in signal coverage in step 1106. Also, the geotagged PCI data captures are used to determine if interference is causing any issues in step 1107 and locates where the issues are using the merged geotagged data in step 1108. Note that the scanner may have a spectrum analyzer built in as well for searching and locating signal interference sources. Each of these technical steps may be performed by logic, software, hardware, firmware, or any combination thereof stored in memory on the PCI scanner or the UAV.

Figure 12:
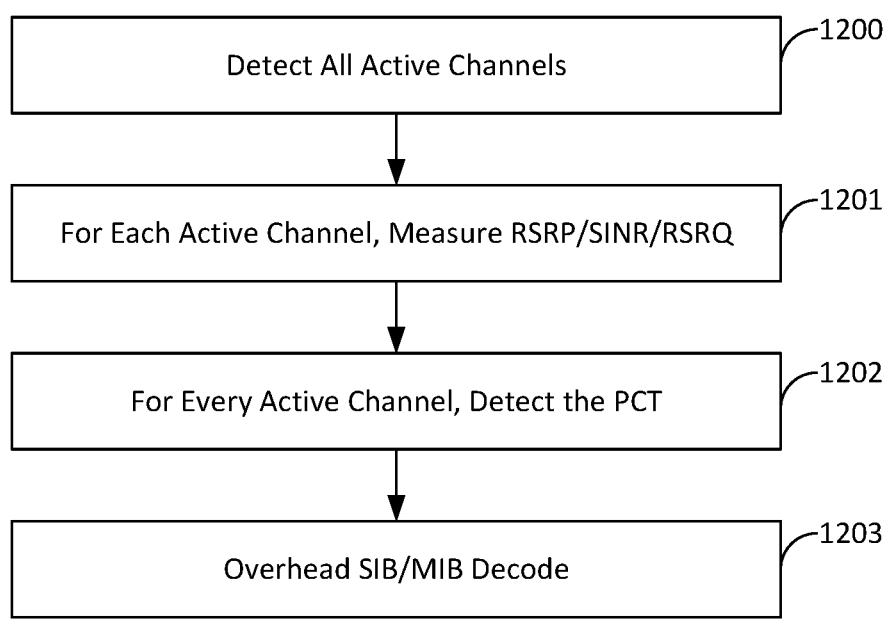
FIG. 12 is a flowchart depicting exemplary architecture and functionality of the UAV of FIG. 2 performing a sector test.

FIG. 12 is a flowchart depicting exemplary architecture and functionality of a sector test turn by the UAV 103. In step 1200 the PCI scanner detects all the channels in step 1200. Detecting all the channels enables the PCI scanner to find if a cell ID is locked, barred, or off-air.

For every channel detected in step 1200, the Reference Signal Received Power (RSRP), the signal to interference noise ratio (SINR), and the reference signal received quality (RSRQ) are measured in step 1201. These quantities allow comparison of power across cell IDs on a sector to look for cabling or configuration issues.

For every active channel, the PCI is detected in step 1202. The PCI determines if coax cables are crossed or find configuration issues.

The overhead system information block (SIB)/master information block (MIB) decode is determined in step 1203. This allows evolved Node B (eNB) Configurations to be read to find power control, mobility, and registration errors.

In one embodiment, the drone can test mmWave FR2 5G. Note that 5G FR2 (Frequency Range 2) consists of the operational frequencies that have been allocated to 5G in the mmWave region (above 24 GHz). These bands aim to provide high performance 5G as large amounts of bandwidths are available for use. The mmWave FR2 5G testing decodes the Sub6 GHz eNB-CellID for populating 5GNR anchors. Sub-6 GHz refers to mid and low-frequency bands under 6 GHz. Low-frequency bands are under 1 GHz, while mid-bands range from 3.4 GHz to 6 GHz and are not considered "mmWave." Each of these technical steps may be performed by logic, software, hardware, firmware, or any combination thereof stored on memory on the PCI scanner or the UAV.

Figure 13:
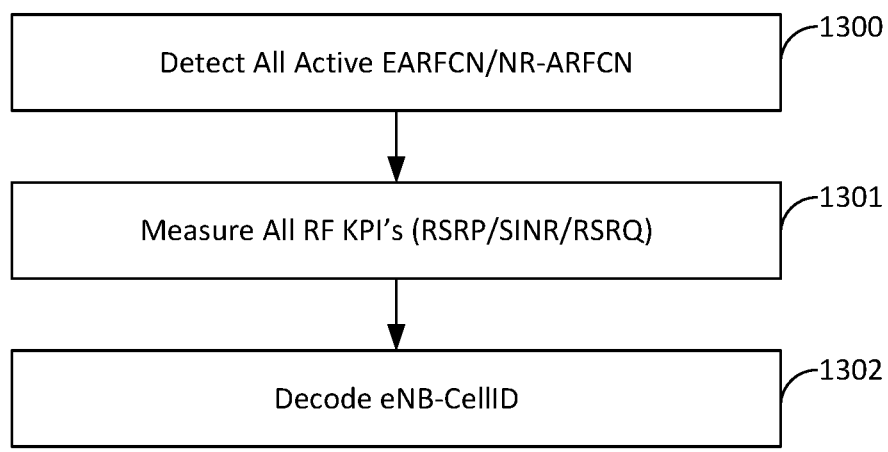
FIG. 13 is a flowchart depicting exemplary architecture and functionality of the UAV of FIG. 2 performing a coverage test.

In one embodiment, as shown in FIG. 13 the drone may perform coverage testing. In step 1300, the drone detects all active EARFCN/NR-ARFCN (4G/5G Channels) active in an area. Note that EARFCN stands for E-UTRA Absolute Radio Frequency Channel Number. In LTE, the carrier frequency in the uplink and downlink is designated by EARFCN, which ranges between 0-65535. EARFCN uniquely identify the LTE band and carrier frequency. An Absolute Radio-Frequency Channel Number (ARFCN) is a code that specifies a pair of reference frequencies used for transmission and reception in radio system. In a FDD system one ARFCN number is required for downlink and another for uplink as downlink and uplink frequencies are different while for TDD system only one ARFCN number is enough as downlink and uplink frequency remains same. Term ARFCN started from GSM and evolved with the new technologies like it was known as UARFCN for UMTS/WCDMA, named as EARFCN for E-UTAR/LTE and now renamed as NR-ARFCN for 5G/New Radio. NR-ARFCNs for 5G new radio are defined in 3GPP specification 38.101-1 and 38.101-2.

In step 1301, the drone measures all radio frequency (RF) key performance indicator KPI's (RSRP/SINR/RSRQ) for all channels and eNB-Cell IDs to provide a total coverage and eNB footprint analysis report.

In step 1302, the drone decodes the eNB-CellID to know which eNB the signal is coming from. Each of these technical steps may be performed by logic, software, hardware, firmware, or any combination thereof stored on memory of the PCI scanner or the UAV.

What we claim is:

1. A system, comprising
an unmanned aerial vehicle (UAV);
a physical cell identity (PCI) scanner coupled to the UAV, the scanner covering frequencies using an omni-directional or directional antenna for capturing PCI data;
logic configured to geotag the PCI data with a latitude, a longitude, an altitude, and a direction of the UAV, the logic further configured to save the data in files for analyzation, the logic further configured to generate three-dimensional models using the geotag PCI data to find weak points in signal coverage.

2. The system of claim 1, wherein the three-dimensional data is used to determine if interference is causing issues and locates where the issues are using merged geotagged data.

3. The system of claim 1, wherein the PCI scanner further comprises a spectrum analyzer for searching and locating signal interference sources.

4. The system of claim 1, wherein the PCI scanner is used for a sector test.

5. The system of claim 4, wherein the sector test comprises detecting all active channels to find if a cell identifier (Cell ID) is locked, barred, or off-air.

6. The system of claim 5, wherein the sector test further comprises measuring RSRP/SINR/RSRQ to compare power across Cell IDs on a sector to look for cabling or configuration issues.

7. The system of claim 6, wherein the sector test further comprises detecting the PCI for every active channel to determine PCI configuration issues or crossed coax cables.

8. The system of claim 7, wherein the sector test further comprises decoding overhead SIB/MIB to read eNB configurations to find power control, mobility, and registration errors.

9. The system of claim 1, wherein the PCI scanner is used for a mmWave FR2 5G test.

10. The system of claim 9, wherein the mmWave FR2 5G test comprises decoding the Sub6 gHz eNB-CellID for populating 5GNR anchors.

11. The system of claim 1, wherein the PCI scanner is used for a coverage test.

12. The system of claim 11, wherein the PCI scanner detects all active EARFCN/NR-ARFCN, including 4G/5G channels, active in an area.

13. The system of claim 12, wherein the PCI scanner is further configured to measure all RF KPI's (RSRP/SINR/RSRQ) for all channels and eNB-Cell ID's.

14. The system of claim 13, wherein the PCI scanner if further configured to generate a total coverage and eNB footprint analysis report.

15. The system of claim 14, wherein the PCI scanner is further configured to decode eNB-CellID to identify which eNB a signal is coming from.

* * * * *